United States Patent [19]

Auerbach

[11] Patent Number: 4,526,807
[45] Date of Patent: Jul. 2, 1985

[54] METHOD FOR DEPOSITION OF ELEMENTAL METALS AND METALLOIDS ON SUBSTRATES

[75] Inventor: Abraham Auerbach, Albany, N.Y.

[73] Assignee: General Electric Company, Schenectady, N.Y.

[21] Appl. No.: 604,661

[22] Filed: Apr. 27, 1984

[51] Int. Cl.³ .............................................. B05D 3/06
[52] U.S. Cl. .................................... 427/53.1; 427/96; 427/98
[58] Field of Search ........................ 427/53.1, 96, 98

[56] References Cited

U.S. PATENT DOCUMENTS

| | | |
|---|---|---|
| 3,073,784 | 1/1963 | Endrey . |
| 3,073,785 | 1/1963 | Angelo . |
| 3,234,044 | 2/1966 | Andes et al. ........................ 427/96 |
| 3,451,813 | 6/1969 | Kinney et al. ...................... 427/96 |
| 3,808,041 | 4/1974 | Rosenberger et al. ............. 427/96 |
| 3,994,727 | 11/1976 | Polichette et al. .................. 427/96 |
| 4,042,006 | 8/1977 | Engl et al. ......................... 427/43.1 |
| 4,221,826 | 9/1980 | Baltrushaitis et al. ............. 427/96 |
| 4,229,232 | 10/1980 | Kirkpatrick ....................... 219/121 L |

OTHER PUBLICATIONS

St. Clair et al., *J. Am. Chem. Soc.*, 102, 876–878 (1980).

*Primary Examiner*—John H. Newsome
*Attorney, Agent, or Firm*—William H. Pittman; James C. Davis, Jr.; James Magee, Jr.

[57] ABSTRACT

Metals and metalloids may be deposited in the form of conducting lines, spots and the like by preparing a solution or dispersion of a reducible metal or metalloid compound in an oxidizable organic matrix such as a polyamic acid or polyimide, coating the substrate with said solution or dispersion, and contacting the coated substrate with a beam of localized radiation absorbable by said coated substrate, typically a laser beam.

7 Claims, No Drawings

METHOD FOR DEPOSITION OF ELEMENTAL METALS AND METALLOIDS ON SUBSTRATES

This invention relates to the deposition of metals and metalloids in the elemental state, and more particularly to an improved method therefor which enables the deposition of conductive metal or metalloid lines, spots, etc., of very high resolution.

Various methods are known for the reduction of metals and metalloids (hereinafter sometimes collectively designated "metals" for brevity) to the elemental state in the form of mirrors or similar coherent layers. Among these are electroplating and electroless plating. Another method, disclosed in U.S. Pat. Nos. 3,073,784 and 3,073,785 and in St. Clair et al., *J. Am. Chem. Soc.*, 102, 876–878 (1980), involves the dissolution of a salt of the metal in an organic matrix, typically a polyamic acid, followed by heating to effect reduction of the metal, presumably by the organic matrix. Among the metals which are disclosed as having been deposited in this way are silver, copper, nickel, chromium, manganese and palladium.

In recent years, considerable interest has developed in methods for making ultrafine elemental metal lines, spots and the like on non-conductive substrates. Such high resolution deposition is of interest in electronic applications such as the manufacture of printed circuit boards, prerecorded audio and video discs, connections to electronic chips, semiconductive layers and the like. The previously described metal deposition techniques cannot conveniently be used for this purpose, since the attainment of high resolution is difficult or impossible.

A principal object of the present invention, therefore, is to provide an improved method of depositing elemental metals or metalloids on non-conductive substrates.

A further object is to provide such a method which is capable of high-resolution deposition, typically in the form of fine lines or spots.

A still further object is to provide such a method which utilizes relatively inexpensive chemicals and requires a relatively low expenditure of energy.

Other objects will in part be obvious and will in part appear hereinafter.

In its most general sense, the present invention includes a method of depositing elemental metal or metalloid on a non-conductive substrate which comprises the steps of preparing a solution or dispersion of at least one reducible metal or metalloid compound in an oxidizable organic matrix, coating said substrate with said solution or dispersion, and contacting said coated substrate with a beam of localized radiation absorbable by said coated substrate, thereby causing reduction of said metal or metalloid to the elemental state by said matrix.

The present invention is operative for the deposition of a wide variety of metals. For the most part, said metals are those which are not strongly electropositive; that is, which are relatively stable in the elemental state. Illustrative elements are those of Groups Ib, IIb, IVa, Va, VIa, VIb, VIIb and VIII of the Periodic Table. Those in Groups Ib, VIa and VIII having atomic weights within the range 60–200 are especially preferred; these include copper, silver, gold, palladium, platinum, selenium and tellurium.

The substrates on which metals can be deposited according to this invention generally include all non-conductive substrates, including non-conductive coatings on conductive materials such as metals. Illustrative substrate materials are ceramics and resinous materials. It is also within the scope of the invention to "float" elemental metal materials on liquids, which may be flowable at room temperature or supercooled.

In the first step of the method of this invention, at least one reducible metal compound is dissolved or dispersed in an oxidizable organic matrix. Suitable metal compounds include simple and complex salts and coordination compounds. Examples of suitable compounds are silver nitrate, sodium hexachloroplatinate, potassium hexachloroplatinate, potassium hexachloroplatinate, potassium hexachloropalladate, copper(II) hexammine chloride, cuprous chloride, tellurium tetrachloride and selenium tetrachloride.

As the oxidizable organic matrix, there may be used any organic material which oxidizes smoothly when in contact with said reducible metal compound; that is, which does not react violently therewith. For the most part, the organic matrix comprises at least one nitrogen compound, typically containing amine, amide or similar linkages. Thus, operative nitrogen compounds include amines, amides, imides, urethanes, nitriles and nitrogen heterocycles.

Among the suitable organic materials are monomeric compounds such as pyridine, N-methylpyrrolidone, acetonitrile, dimethylformamide, diethylacetamide and ethyl phenylcarbamate, with the dialkylformamides being preferred. Especially useful, however, are matrices comprising nitrogen-containing polymers such as polyamides, polyimides, polyamic acids, polyurethanes, amine-modified polyphenylene oxides, polymeric nitrogen heterocycles (e.g., polyvinylpyrrolidone) and polynitriles. A particularly desirable class of polymers consists of polyamic acids and polyimides prepared by the reaction of aromatic diamines with dianhydrides such as benzophenonetetracarboxylic acid dianhydride and 2,2-bis[4-(3,4-dicarboxyphenoxy)phenyl]propane dianhydride ("bisphenol A dianhydride").

The metal compound may simply be dissolved or dispersed in the organic material, or an aqueous or organic diluent (which may be one of the monomeric matrix materials) may be used to facilitate solution or dispersion formation. Concentrations of the metal compound in the solution or dispersion are typically on the order of 5–50% and preferably about 10–40% by weight. When a polymeric matrix material is used, it may be employed in solution in an organic solvent, the concentration of the polymer in the solution typically being about 10–30% by weight. The presence of other substances such as emulsifiers or stabilizers in the solution or dispersion is also within the scope of the invention.

If the metal is capable of existing in several positive oxidation states, it is usually preferably maintained in a relatively low state prior to reduction in order to minimize the energy input needed to accomplish said reduction. Thus, for example, cuprous salts are usually preferred over cupric salts. When the metal in the lower oxidation state is subject to oxidation under ambient conditions, an inert or reducing atmosphere such as nitrogen, argon or hydrogen may be employed.

Following formation of the solution or dispersion, the substrate is coated therewith by conventional means such as dipping, spraying, brushing, spin coating, curtain coating or the like. If a diluent has been employed, it is typically removed by conventional means such as evaporation. The system may then be dried, optionally under vacuum, usually at temperatures of about 80°–175° C. The thickness of the coating thus formed will depend on the use to which the coated substrate is to be put; a thickness of about 0.1–10 microns is illustrative.

The product of the second step is a coated article wherein the metal compound is dispersed in the coating material. In the third step, the coated substrate is contacted with a beam of localized radiation which provides the energy necessary for reduction of the metal by the organic matrix.

The radiation may be, for example, an electron beam, a maser or a laser. Thus, the energy may be furnished in discrete or coherent form. Particularly preferred is coherent radiation, especially in laser form. Both pulsed and continuous lasers may be used, and they may be produced by solid or gaseous materials or by semiconductors (e.g., diodes). Gas lasers as exemplified by argon and helium-neon lasers, as well as GaAlAs and similar diode lasers, are typical energy sources for this purpose.

A principal requirement for the energy source in order to be used in the present invention is that it produce an energy level high enough and of the proper wavelength to be absorbed by the coating and thus heat it to a temperature high enough for the reduction of the metal by the organic matrix to take place. A further requirement is that the energy produced thereby be absorbable by the coated substrate so as to produce the required heating. Said energy is frequently absorbed by the solution or dispersion or by the organic matrix, particularly when the latter is a polymer. It is also within the scope of the invention, however, for the substrate itself to absorb said energy and transmit the heat thus produced to the matrix-metal compound combination. This is frequently the case when the matrix is a solvent such as dimethylformamide or N-methylpyrrolidone. As will be apparent, the choice of the laser is thus partly dependent on the choice of matrix and substrate materials. Suitable choices can readily be made by those skilled in the art.

The temperatures required for reduction of metal compounds in systems of the type used in the present invention are typically about 200°–300° C., depending to some extent on the effect of heat on the substrate and the organic matrix. It is generally found that a laser having a power output within the range of about 1–1000 milliwatts is adequate to produce localized temperatures within this range. An advantage of the method of this invention is that the use of a localized energy source permits exposure of only small areas of the substrate to the relatively high reaction temperatures, thus producing an extremely high power density in said small areas and minimizing thermal degradation of the matrix and the substrate in other areas. Moreover, the coated substrate can be translated with respect to the laser (usually at a rate up to about 4 cm./sec. and optionally with computer control, especially for the production of complex circuits) so as to produce thin lines or very small spots of reduced metal thereon, typically with a dimension on the order of 1–50 microns. Line width and the like may be varied by varying metal concentration, power output and/or focusing conditions. This is extremely useful in the production of miniaturized circuits such as those on printed circuit boards.

A number of options are made available by the use of a pulsed laser. For example, lasers having a relatively long pulse length may be used to produce a series of lines or spots, either circular or elongated, of reduced metal, with each pulse producing a single spot. Alternatively, a laser of very short pulse length and high pulse frequency may be employed in substantially the same way as a continuous laser, provided the translation rate of the substrate is adjusted properly.

The method of this invention is illustrated by the following examples. All parts and percentages are by weight.

EXAMPLE 1

A prototype printed circuit board is prepared by laminating $\frac{1}{8}$-ounce copper foil on a polyetherimide substrate (ULTEM polyetherimide, manufactured by General Electric Company), followed by photolithography to produce copper lines spaced 1 cm. apart. The board is spin-coated with a blend of silver nitrate with an approximately 15% solution in N-methylpyrrolidone of a polyamic acid prepared from pyromellitic dianhydride and bis(4-aminophenyl)methane. The coated board is dried in an oven for 15 minutes at 80° C. It is then placed on a translating stage and translated at 1.2 cm./min. as an argon ion laser (wavelength about 500 nm.) is focused thereon at an output power of 50 milliwatts. The laser causes the deposition of a conductive silver line, having a width of about 40 microns and a measured resistance of about 60 ohms, between copper lines.

EXAMPLE 2

The procedure of Example 1 is repeated, except that the silver nitrate concentrations are 20% or 30%, the boards are dried at 90° C. and the laser output power is varied between 50 milliwatts and 1 watt. Silver lines of various widths are obtained. As an example, the line produced at an output power of 50 milliwatts is about 25 microns wide and has a measured resistance of 10 ohms.

EXAMPLE 3

A 2-vinylpyridine polymer is dissolved at 10% in a mixture of 25% N-vinylpyrrolidone and 75% pyridine. Silver nitrate is then dissolved in the resulting solution at a level of 33.3%. The solution is spin-coated on a substrate comprising a polyetherimide similar to that of Example 1, and the coated substrate is dried at 120°–150° C. for 30 minutes. It is then contacted with a GaAlAs diode laser (wavelength about 820 mm.) at a power level of 10 milliwatts to produce reflective silver spots having a diameter of about 4–5 microns.

EXAMPLE 4

A 10% solution of potassium hexachloroplatinate in an approximately 15% solution in N-methylpyrrolidone and acetone of a polyamic acid similar to that of Example 1 is prepared and coated on a glass substrate, which is then dried for 15 minutes at 150° C. The coated substrate is contacted with an argon ion laser focused with a 47 mm. lens and operated at a power level of 200 milliwatts, using a procedure similar to that of Example 1, whereupon highly conductive platinum lines approximately 50 microns wide are produced.

EXMAPLE 5

A solution of 3 parts of cuprous chloride in 2 parts of pyridine and 6 parts of N-methylpyrrolidone is prepared in a nitrogen atmosphere, and 3.5 parts of polyvinylpyrrolidone is added. The resulting solution is spin-coated on a polyetherimide substrate, following the procedure of Example 1, and the coated substrate is dried under nitrogen at 140° C. for 30 minutes. It is then contacted in a hydrogen atmosphere with an argon ion laser at a power level of 50-100 milliwatts, to produce metallic copper lines.

EXAMPLE 6

A solution of 4 parts of copper(I) tetraacetonitrile nitrate and 3 parts of polyvinylpyrrolidone in a mixture of 7 parts of N-methylpyrrolidone and 1 part of pyridine is prepared. A polyetherimide substrate is coated therewith and laser treated as in Example 5, with similar results.

EXAMPLE 7

A solution of 5 parts of $KAu(CN)_2$ and 5 parts of polyvinylpyrrolidone in a mixture of 6 parts of acetonitrile, 1 part of N-methylpyrrolidone and 4.5 parts of dimethylformamide is prepared. The solution is spin-coated on a polyetherimide substrate and laser treated in accordance with Example 5, to produce conductive gold lines.

EXAMPLE 8

Gold(I) chloride, 4 parts, is added slowly to a mixture of 7 parts of N-methylpyrrolidone and 1 part of pyridine, followed by addition of 4 parts of polyvinylpyrrolidone. The resulting solution is spin-coated on a polyetherimide substrate and laser treated as described in Example 7 except that a hydrogen atmosphere is not employed. Similar results are obtained.

EXAMPLE 9

A 10% solution of tellurium tetrachloride in a polyamic acid similar to that of Example 1 is prepared and spin-coated on a glass substrate. Upon contact with an argon ion laser and translation at 0.6 cm./min., elemental tellurium lines are obtained.

EXAMPLE 10

The procedure of Example 9 is repeated, replacing the tellurium tetrachloride with selenium tetrachloride, resulting in similar lines of elemental selenium.

EXAMPLE 11

An alumina substrate is placed in a glass dish containing a solution of 4 parts of silver nitrate and 10 parts of dimethylformamide. The dish is covered with a glass plate and contacted with an argon ion laser (output 500-1500 milliwatts) focused with a 47 mm. lens. Silver lines with widths of 75-125 microns and having measured resistances of 6-100 ohms per cm. are obtained on the glass surface.

The method of this invention has many applications in the field of electronics and the like. For example, it may be used for producing conductive metal lines or semiconductive metalloid (e.g., tellurium or selenium) lines and spots on printed circuit boards. A specific example is a process in which a transparent substrate is coated with a metal compound-doped polymer and an electronic chip is bonded thereto. Upon laser contact, conductive connections with the chip may be formed. Alternatively, copper leads or the like from the chips may be positioned and a photo-patternable coating deposited; this polymer may then be patterned and developed and in turn coated with the metal compound-doped polymer solution, which is then laser treated to form connections and circuits. Another application is in the production of optical storage discs (e.g., video discs) wherein the storage medium is elemental metal.

What is claimed is:

1. A method of depositing conductive elemental metal or metalloid lines or spots on a non-conductive substrate which comprises the steps of preparing a solution or dispersion of at least one reducible metal or metalloid compound in an oxidizable organic matrix comprising a polyamic acid or polyimide prepared by the reaction of at least one aromatic diamine with 2,2-bis propane dianhydride, coating said substrate with said solution or dispersion, and contacting said coated substrate with a beam of localized radiation absorbable by said coated substrate, thereby causing reduction of said metal or metalloid to the elemental state by said matrix.

2. A method according to claim 1 wherein the external radiation is coherent radiation.

3. A method according to claim 2 wherein the metal or metalloid is an element in Group Ib, VIa or VIII of the periodic table having an atomic weight within the range 60-200.

4. A method according to claim 3 wherein the metal or metalloid is copper, silver, gold, palladium, platinum, selenium or tellurium.

5. A method according to claim 4 wherein the external radiation is a laser.

6. A method according to claim 5 wherein the laser is a diode laser.

7. A method of depositing elemental copper or silver lines on a resinous substrate which comprises the steps of preparing a solution of at least one reducible copper or silver compound in an oxidizable organic matrix comprising a polyamic acid or polyimide prepared by the reaction of at least one aromatic diamine with 2,2-bis propane dianhydride, coating said substrate with said solution, and containing said coated substrate with a laser beam produced by a diode laser, the energy imparted by said beam being absorbable by said coated substrate, thereby causing reduction of said copper or silver to the elemental state by said matrix.

* * * * *

UNITED STATES PATENT AND TRADEMARK OFFICE
CERTIFICATE OF CORRECTION

PATENT NO.  : 4,526,807
DATED       : July 2, 1985
INVENTOR(S) : Abraham Auerbach It is certified that error appears in the above-identified patent and that said Letters Patent is hereby corrected as shown below:

Column 6, lines 23-24 and 47-48, "2,2-bis propane" should read --2,2-bis[4-(3,4-dicarboxyphenoxy)phenyl]propane--.

Signed and Sealed this

Fifteenth Day of October 1985

[SEAL]

Attest:

DONALD J. QUIGG

*Attesting Officer*

*Commissioner of Patents and Trademarks—Designate*